United States Patent [19]
Green

[11] Patent Number: 5,940,713
[45] Date of Patent: Aug. 17, 1999

[54] METHOD FOR CONSTRUCTING MULTIPLE CONTAINER CAPACITOR

[75] Inventor: James E. Green, Caldwell, Id.

[73] Assignee: Micron Technology, Inc., Boise, Id.

[21] Appl. No.: 08/609,360

[22] Filed: Mar. 1, 1996

[51] Int. Cl.⁶ .................................................. H01L 21/20
[52] U.S. Cl. ........................................... 438/396; 438/253
[58] Field of Search ................................... 438/253, 254, 438/255, 396, 397, 398; 148/DIG. 14

[56] References Cited

U.S. PATENT DOCUMENTS

| | | |
|---|---|---|
| 5,037,773 | 8/1991 | Lee et al. . |
| 5,182,232 | 1/1993 | Chhabra et al. . |
| 5,241,201 | 8/1993 | Matsuo et al. . |
| 5,278,091 | 1/1994 | Fazan et al. .............................. 438/255 |
| 5,286,344 | 2/1994 | Blalock et al. . |
| 5,292,677 | 3/1994 | Dennison . |
| 5,298,463 | 3/1994 | Sandhu et al. . |
| 5,300,463 | 4/1994 | Cathey et al. . |
| 5,340,763 | 8/1994 | Dennison . |
| 5,340,765 | 8/1994 | Dennison et al. . |
| 5,364,809 | 11/1994 | Kwon et al. .............................. 438/396 |
| 5,389,568 | 2/1995 | Yun ............................................ 438/396 |
| 5,418,180 | 5/1995 | Brown . |
| 5,498,562 | 3/1996 | Dennison et al. ....................... 438/396 |
| 5,793,076 | 8/1998 | Fazan et al. . |

FOREIGN PATENT DOCUMENTS

| | | |
|---|---|---|
| 6-061422 | 3/1994 | Japan . |

OTHER PUBLICATIONS

"Hemispherical Grained Si Formation on in situ Phosphorus Dopes Amorphpus–Si Electrode for 256Mb DRAM's Capacitor"I, Watanabe et al., IEEE Transactions on Electron Devices, vol. 42, No. 7, Jul. 1995, pp. 1247–1254.

Matsuo et al., "Spread–Vertical–Capacitor Cell (SVC) for High–Density dRAM's", IEEE Transactions on Electron Devices, vol. 40, No. 4, Apr. 1993, pp. 750–754.

Wolf, S. and Tauber, R.N., "Silcon Processing for the VLSI Era—Process Technology," vol. I, pp. 191–194, 1986. (No Month).

*Primary Examiner*—Tuan H. Nguyen
*Attorney, Agent, or Firm*—Knobbe, Martens, Olson & Bear, LLP

[57] ABSTRACT

A method is provided for forming a bottom capacitor electrode. While requiring only one mask step, the process forms a container-within-container structure having a high surface area. Specifically, the method comprises providing a structural layer over an insulating layer, and a protective layer over the structural layer. An initial via is formed within the structural layer, and this initial structure is lined with a conductive material, thus forming the outer container of the final structure. A spacer is then formed around the container sidewalls and the via extended through the underlying insulating layer to expose a circuit node. Another conductive layer is then deposited forming the inner container in electrical contact with the circuit node and the conductive outer container, but separated from the outer container sidewalls by the spacer. The via may then be filled and polished, and the spacer, structural layer, and filler selectively removed.

32 Claims, 5 Drawing Sheets

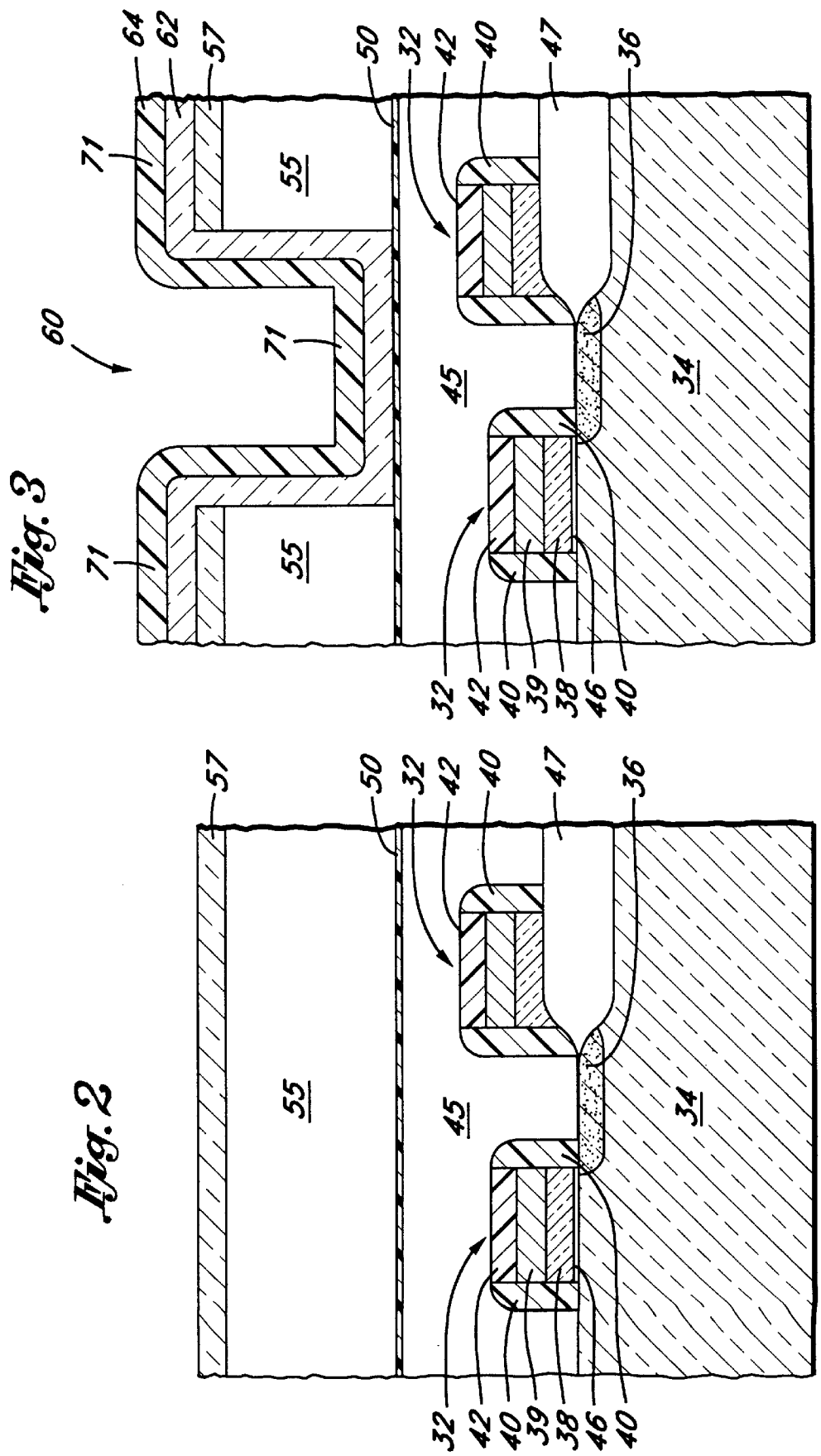

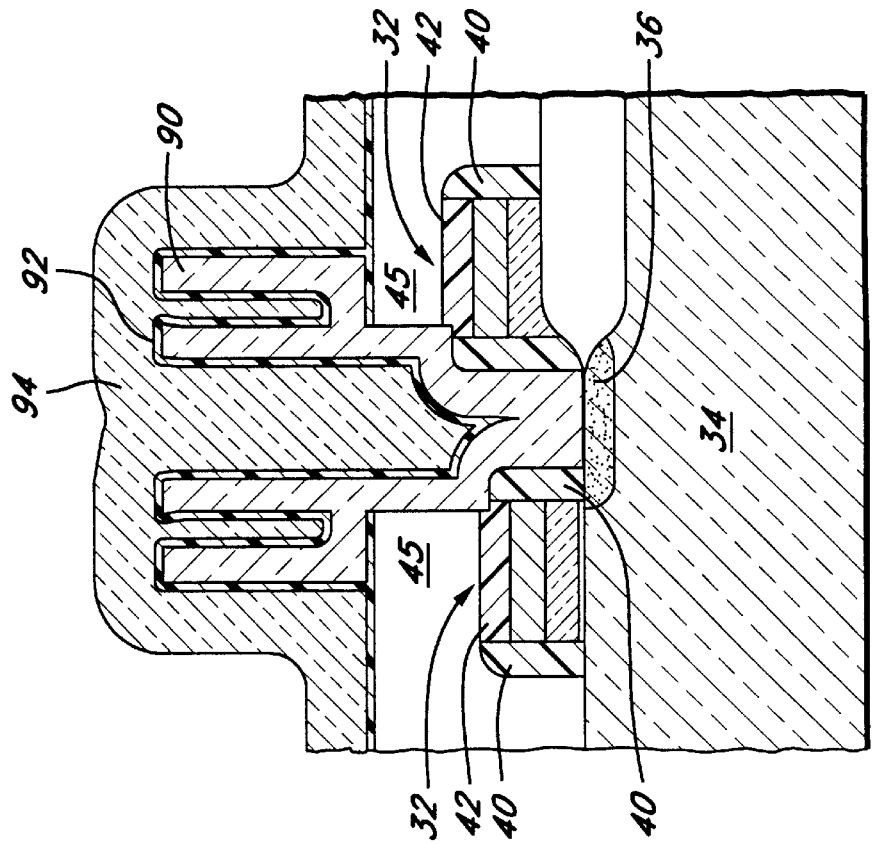
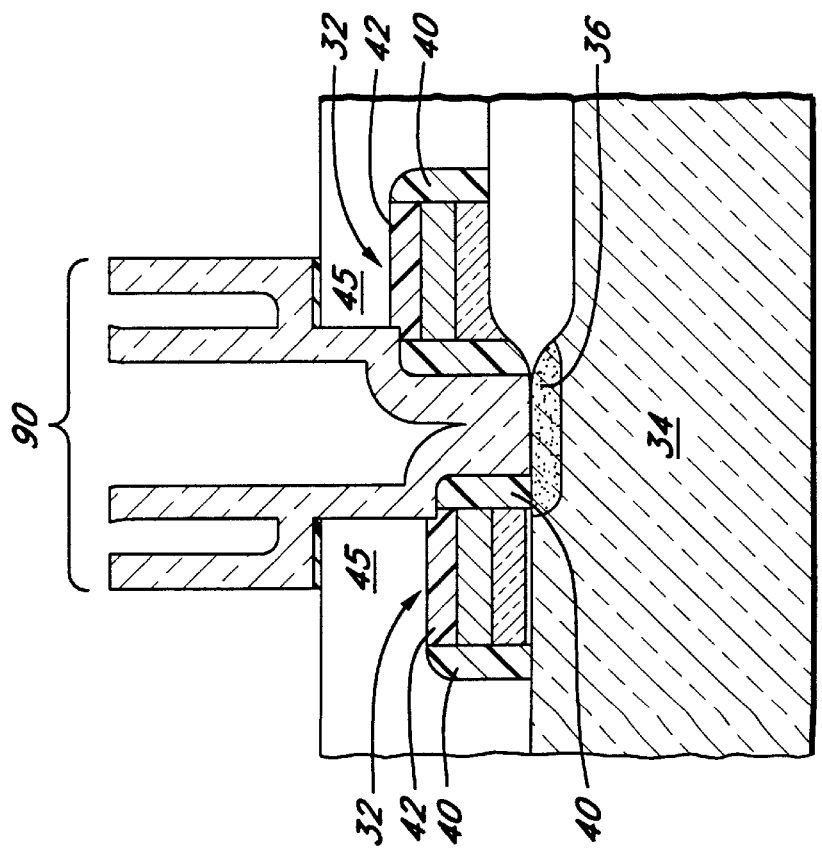

METHOD FOR CONSTRUCTING MULTIPLE CONTAINER CAPACITOR

FIELD OF THE INVENTION

The present invention relates to capacitors for use in integrated circuits, and more particularly to the fabrication of multiple container three-dimensional stacked cell capacitors for high density random access memory arrays.

BACKGROUND OF THE INVENTION

Recent advances in the miniaturization of integrated circuits have led to smaller chip areas available for devices. High density dynamic random access memory chips (DRAMs), for example, leave little room for the storage node of a memory cell. Yet, the storage node (capacitor) must be able to store a certain minimum charge, determined by design and operational parameters, to ensure reliable operation of the memory cell. It is thus increasingly important that capacitors achieve a high stored charge per unit area.

Traditionally, capacitors integrated into memory cells have been patterned after the parallel plate capacitor. An interlayer dielectric material is deposited between the deposition of two conductive layers, which form the capacitor plates. Several techniques have recently been developed to increase the total charge capacity of the cell capacitor without significantly affecting the chip area occupied by the cell. These include the use of new high dielectric materials between the plates. Other techniques concentrate on increasing the effective surface area of the plates by creating folding structures, such as trench or stacked capacitors. Such structures better utilize the available chip area by creating three dimensional shapes to which the conductive plates and interlayer dielectric conform.

Stacked capacitors for memory cells may be formed within contact vias etched out of thick insulating layers over a semiconductor substrate 10. FIG. 1 illustrates a container capacitor 12 formed by such a method, as disclosed in U.S. Pat. No. 5,340,765, issued to Dennison et al. on Aug. 23, 1994. A first insulating layer 14 provides electrical isolation for underlying electronic devices such as thin film field effect transistors (FETs). Another insulating layer (not shown) is formed over the first insulating layer 14, and a via etched through the second insulating layer 14 may act as a template for the container capacitor. (FIG. 1 is a schematic cross-section which does not show the backwall of the container 12. In reality, the container resembles a three-dimensional cylinder.)

Via walls are lined with a conductive material 16, usually doped polycrystalline silicon (polysilicon). A planarizing etch is conducted to remove excess polysilicon over the top surface of the second insulating layer. The remaining second insulating layer may then be etched away to expose an outside surface 18 of the polysilicon container 12. The polysilicon walls 16 represent the bottom or storage electrode of the capacitor container 12. A thin dielectric layer 20 is then formed over both the outside and the inside of the polysilicon container walls, followed by a second conductive layer 22 (e.g., also polysilicon), which represents the top or reference electrode for the memory cell capacitor 12. By following the contours of the three-dimensional container structure, the effective electrode surface area is substantially increased, allowing for substantially greater capacitance.

More complex structures, such as container-within-container or multiple pin structures, may even further increase electrode surface area and allow the extension of conventional fabrication materials to future generation memory devices. Fabrication of such structures, however, requires commensurately more complex processes, including multiple mask, deposition, and/or etch steps. Delicate container and multiple pin structures are extremely susceptible to breakage during inter-chamber transportation between these multiple process steps, which breakage could lead to shorting between the storage nodes of adjacent memory cells on a memory chip. Such shorting, in turn, tends to cause failure of an entire memory device. U.S. Pat. No. 5,340,763, issued Aug. 23, 1994 to Dennison, discloses one method of forming multi-pin stacked capacitors while minimizing or containing the damage caused by such breakage.

Contact must also be made between the capacitor 12 and an underlying active area 25 of the semiconductor substrate 10. The contact must be formed between narrowly spaced transistor gates 28 (e.g., DRAM word lines), as shown in FIG. 1. Because the gates 28 of current memory cells are closer than 0.35 micron, and because the storage node should be as wide as possible to maximize electrode surface area, the contact is often formed by an etch mask separate from that which forms the contact via used to create the capacitor container 12. FIG. 1 illustrates a contact plug 30 formed by a separate mask prior to formation of the container structure. Combined with the multiple mask steps required of complex, multiple container or multiple pin capacitors, fabrication expense and risk of mask misalignment are increased.

A need therefore exists for a lower cost, reliable process for fabricating complex capacitor structures in integrated circuits. Ideally, such a process should minimize the number of mask steps required to create a high-surface area capacitor and form contact with underlying access devices.

SUMMARY OF THE INVENTION

A method is disclosed for fabricating a bottom electrode for an integrated circuit container capacitor. According to one aspect of the invention, the method comprises:
 forming a first conductive layer over a structural layer formed over a semiconductor substrate;
 forming a via through first conductive layer and the structural layer, the via having a substantially vertical sidewall;
 depositing a second conductive layer over the first conductive layer and into the via;
 forming a sidewall spacer over the second conductive layer at the via sidewall;
 performing a contact etch through an insulating layer underlying the structural layer, the contact etch extending the via downward to expose an active area within the semiconductor substrate;
 depositing a third conductive layer over the structural layer and into the extended via, the third conductive layer forming electrical contact with the active area and with the second conductive layer;
 planarizing the structural layer below portions of the conductive layers overlying the structural layer; and
 substantially removing the structural layer and the sidewall spacer.

According to another aspect of the present invention, the method comprises:
 forming a conductive outer container within a structural layer overlying an insulating layer;
 forming a spacer around an outer container sidewall;

performing a contact etch through a bottom of the outer container and through the insulating layer to expose the circuit node; and forming a conductive inner container in electrical contact with the circuit node and with the outer container, an inner container sidewall separated from the outer container sidewall by the spacer.

According to yet another aspect of the invention, the method comprises:

providing a structural layer over an insulated, partially fabricated integrated circuit, the circuit including a semiconductor wafer;

forming a protective layer over the structural layer;

etching a via through the protective layer and the structural layer;

lining the via with an outer conductive layer;

forming a spacer over the outer conductive layer adjacent a via sidewall;

performing a contact etch through a via bottom to expose a circuit node;

forming an inner conductive layer over the spacer after the contact etch, the inner conductive layer forming electrical contact with the active area;

polishing a top portion of the integrated circuit; and selectively removing the spacer while leaving the outer and inner conductive layer substantially intact.

Further aspects of the present invention will become apparent from the following description, the attached claims, and the accompanying drawings.

BRIEF DESCRIPTION OF THE DRAWINGS

FIGS. 3–9 illustrate generally the method steps of the preferred embodiment.

DETAILED DESCRIPTION OF THE PREFERRED EMBODIMENT

Although the present description focuses on the context of a dynamic random access memory (DRAM) cell, it will be understood that the present invention may have utility in many applications where conductive structures having high surface areas are desired. Such applications include capacitors of all sorts, and especially the bottom electrodes of capacitors integrated into electronic circuitry. The invention has particular utility where the conductive structure must make electrical contact to underlying circuit devices.

Figure 2:
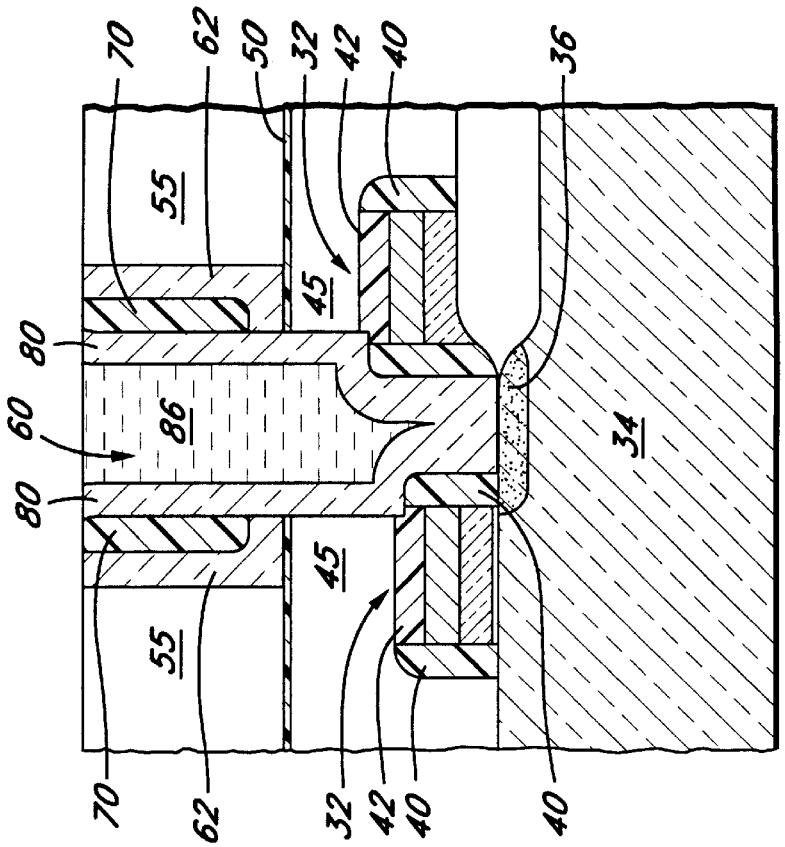
FIG. 2 is a schematic cross-section of a partially fabricated memory cell in an integrated circuit, constructed in accordance with a preferred embodiment of the present invention.

FIG. 2 illustrates a starting point for the preferred embodiment of the present invention. As with prior art DRAM memory cells, a pair of word lines 32 are formed over a semiconductor substrate 34 on either side of a doped device active area 36, or circuit node 36, within the substrate 34. The word lines 32 are each constructed of a polysilicon layer 38 and a tungsten silicide layer 39, in accordance with current integrated circuit technology. These polycide word lines 32 are isolated by a plurality of vertical dielectric spacers 40, word line insulating caps 42, and a thick, planarized insulating layer 45. The word lines 32 are separated from the substrate by either a thin gate oxide 46 or a thick field oxide 47, as is conventional in integrated circuit fabrication. Word lines in currently produced DRAMs can be less than 0.35 micron ($\mu$) apart, while future generation DRAMs are expected to have less than 0.25 $\mu$ spacing.

The insulating layer 45 may comprise any of a number of dielectric materials, such as oxide or TEOS, but in the first preferred embodiment it comprises silicon dioxide doped for better reflow characteristics, specifically borophosphosilicate glass (BPSG). The BPSG may be deposited by conventional processes to a thickness between about 0.6 micron and 2.0 micron, most preferably about 1.0 micron. The vertical spacers 40 and word line caps 42, which isolate the word lines 32, comprise silicon nitride (preferably stoichiometric $Si_3N_4$). The skilled artisan, however, will recognize from the following detailed description that other dielectric materials may be equally viable in conjunction with the present invention, insofar as adequately selective etches are available. The structure described to this point may be fabricated by conventional techniques which are well known in the art of integrated circuit fabrication.

For the preferred embodiment, a thin etch stop film 50 (preferably between about 60 Å and 500 Å, most preferably about 250 Å) is formed over the insulating layer 45, as shown, and a thick, planarized structural layer 55 is formed over etch stop film 50. The composition for these layers is chosen such that the structural layer 55 may be etched selectively against the etch stop 50. "Selectively," for purposes of the present invention, shall mean that the structural layer 55 may be etched at a rate faster than the etch stop 50, such that the skilled artisan may end the etch step after the structural layer 55 has been removed but before the underlying insulating layer 45 is etched. Most preferably, the structural layer 55 may be etched with greater than 100:1 selectivity. For example, the preferred material for the etch stop film 50 is silicon nitride, while the structural layer 55 of the preferred embodiment comprises BPSG (doped oxide). Silicon nitride deposited by low pressure CVD etches very slowly in buffered HF solution, for example, while oxide etches very quickly in the same etchant. Most preferably, therefore, the etch stop film 50 is formed by reacting dichlorosilane ($SiCl_2H_2$) and ammonia ($NH_3$). This reaction is discussed in Wolf and Tauber, "Silicon Processing for the VLSI Era: Vol. 1—Process Technology," p. 193, Lattice Press 1986, the discussion of which is hereby incorporated by reference. It will be understood from the disclosure below, however, that the etch stop film 50 is not critical and its function may be replaced with carefully time-controlled etches, optical endpoint measurement techniques, etc.

A first conductive layer 57 is next deposited, preferably comprising polysilicon having a thickness between about 200 Å and 1,500 Å, and most preferably about 500 Å. This polysilicon, however, does not form part of the final bottom capacitor structure and so need not be conductively doped. The first conductive layer 57 serves as a replacement for a later-deposited second conductive layer, which is at least substantially etched away by a first portion of a contact etch exposing the substrate 34. At least part of the first conductive layer 57 then remains to protect the structural layer 55 during the remainder of the contact etch, as will be understood from the description below and from the accompanying drawings.

Like the etch stop film 50, the structural layer 55 and polysilicon first conductive layer 57 should also be deposited by known CVD methods to achieve optimal conformality, though deposition methods are not critical to the present invention. Additionally, the BPSG of the insulating layer 45 and structural layer 55 should be planarized prior to deposition of their respective overlying layers. Glass reflow or chemical mechanical planarization, for example, are two possibilities for this planarization.

FIG. 3 illustrates the structure of FIG. 2 after a via 60 has been etched over the active area 36 through the first conductive layer 57 and the structural layer 55, stopping at the etch stop film 50. This etch should be performed through a conventional photoresist mask. For the preferred embodiment, the polysilicon of the first conductive layer 57 may be wet etched by nitric acid ($HNO_3$) and hydrofluoric acid (HF).

The BPSG of the structural layer 55 is preferably etched by a process selective against the silicon nitride of the etch stop 50 and the polysilicon of the first conductive layer 57. Alternatively, in embodiments without the etch stop film 50, the contact etch may time-controlled. For example, a diluted HF solution (between 10:1 and 100:1 $H_2O$:HF) may etch the BPSG at a controllable rate to the appropriate level, and buffering agents such as $NH_4F$ may stabilize the reactions to maintain a constant etch rate.

Most preferably, however, the structural layer should be etched by a selective, anisotropic process, providing vertical sidewalls for the via 60. A reactive ion etch (RIE) reactor may flow 25 sccm of $CF_4$ and 35 sccm of $CHF_3$ along with an argon carrier gas. The addition of $CH_2F_2$ may improve the selectivity of the oxide etch over silicon nitride of the etch stop film 50, as disclosed in U.S. Pat. No. 5,286,344, issued Feb. 15, 1994 to Blalock, et al., the disclosure of which is hereby incorporated by reference. The chamber pressure should be maintained between about 50 mTorr and 200 mTorr, most preferably at about 100 mTorr, and the applied RF energy at between about 500 W and 800 W, most preferably about 700 W. Temperatures should be between about 30° C. and 60° C., and more preferably between about 35° C. and 50° C. Both etches (i.e., of the polysilicon and the BPSG) may be performed through the same resist mask, which should then be removed prior to the depositions presently to be described.

Although the via 60 may be any shape defined by the mask, it should generally be cylindrical, as is conventional in the art. Additionally, the via 60 should be wider than the spacing between word lines 32, preferably characterized by a diameter between about 0.5 micron and 1.0 micron, most preferably about 0.8 micron.

The via 60 is then successively lined with a second conductive layer 62 and a layer of spacer material 64. The second conductive layer 62 preferably comprises the same material and approximately the same thickness as the first conductive layer 57, namely polysilicon having a thickness between about 200 Å and 1,500 Å, and most preferably about 500 Å. It will be understood that thicknesses greater than about 1,500 Å for the conductive layers (including a third conductive layer to be deposited) may occupy too much of the preferred via 60 of 0.8 micron diameter, leaving too little room for later deposition of the cell dielectric and top electrode. Since part of the second conductive layer 62 ultimately forms part of the bottom electrode (defining an outer container of the preferred embodiment), the preferred polysilicon of this layer 62 should be conductively doped. Although ion implantation is possible for this conductive doping, in-situ phosphorus doping is preferred. Thus, the second conductive layer 62 is most preferably formed by a CVD process flowing a silicon source, such as silane ($SiH_4$), and a phosphorus source, such as phosphine ($PH_3$). The second conductive layers 62 may also include a roughened surface (not show), such as hemispherical grained silicon as described in the "Background" section above.

The spacer material 64 comprises a material which may be selectively etched without excessively damaging the second conductive layer 62. The spacer material 64 of the preferred embodiment comprises silicon nitride, like the word line insulating caps 42 and spacers 40 and the etch stop film 50. This layer 64 should be thicker than the conductive layers 57 and 62, preferably between about 500 Å and 1,000 Å, and most preferably about 700 Å.

Figure 1:
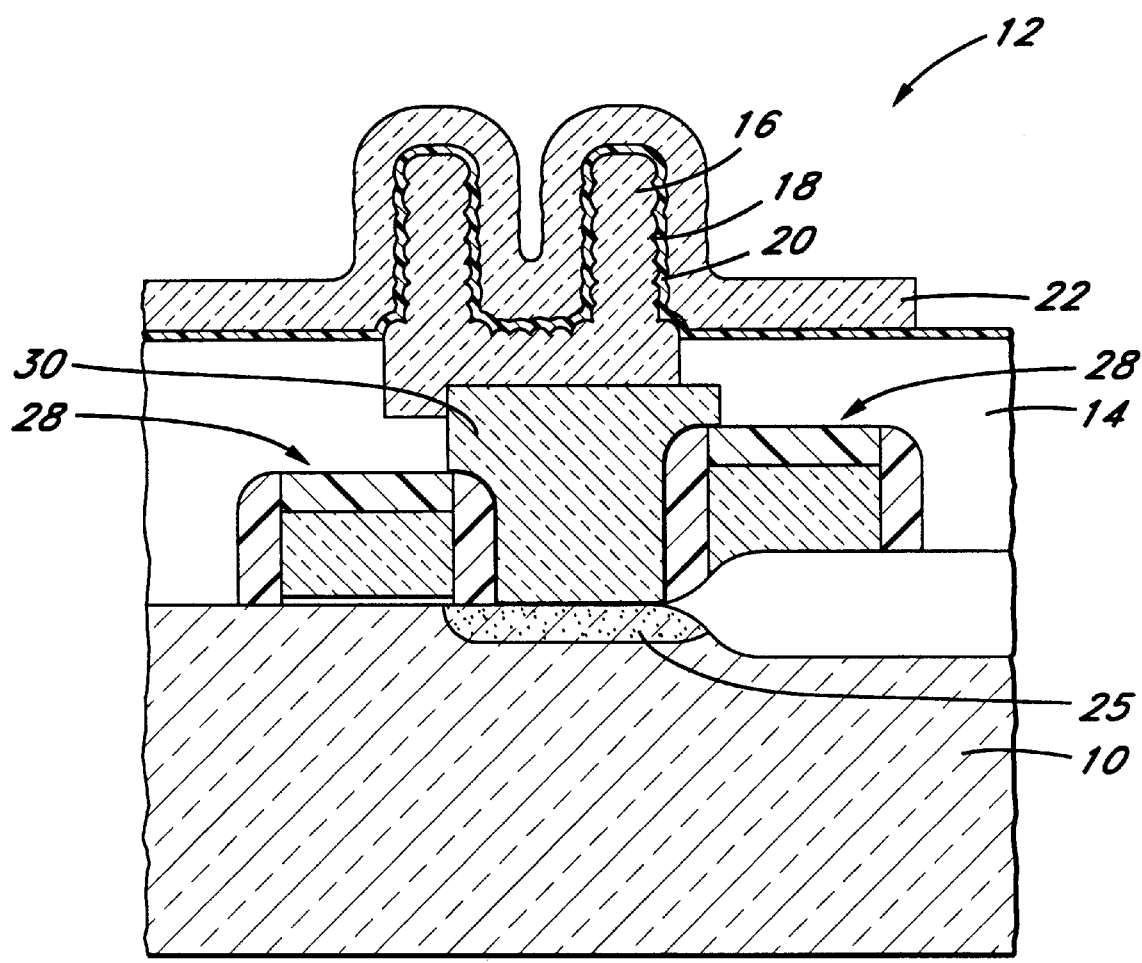
FIG. 1 is a partial cross-sectional view of a prior art dynamic random access memory cell, including a container capacitor.
Figure 4:
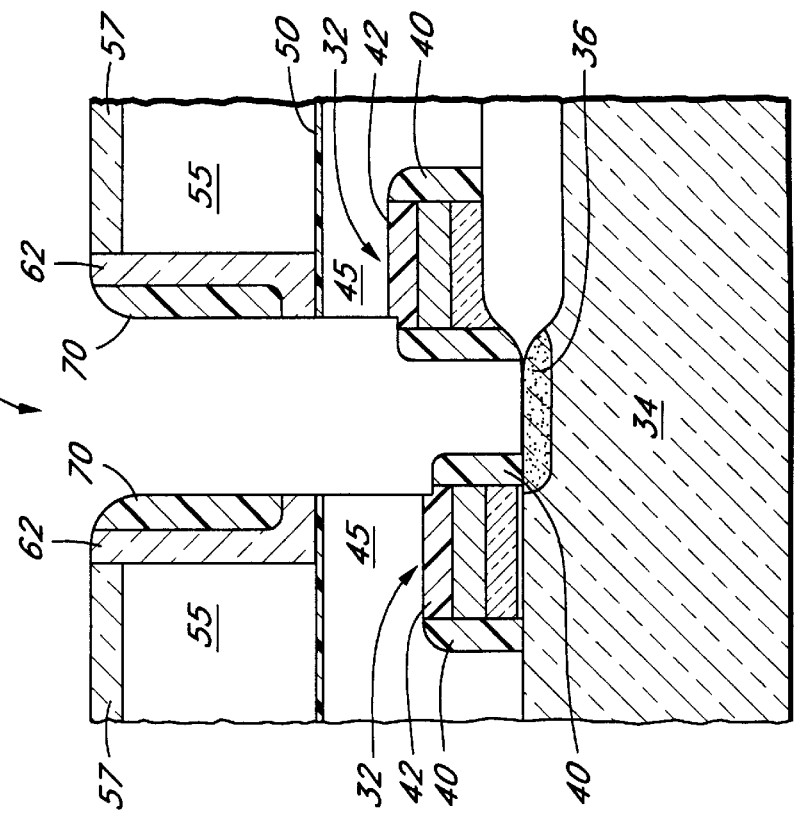

FIG. 4 illustrates the circuit after formation of a sidewall spacer 70 along the interior wall of the via 60 (recalling that the via is preferably cylindrical in shape). The sidewall spacer 70 is formed by a spacer etch, which anisotropically etches the layer of spacer material 64. The spacer etch removes horizontal portions 71 (FIG. 3) of the silicon nitride layer 64, at least exposing the polysilicon of the second conductive layer 64 both at a via bottom 72 (FIG. 4) and at a top surface 74 of the integrated circuit (i.e., exposing horizontal portions of the second conductive layer 64).

The concept of spacer etch in general is well known in the art. For example, the vertical dielectric spacers 40, which isolate the word lines 32, are also formed by a spacer etch. In fact, since both sidewall spacer 70 and vertical dielectric spacers 40 comprise silicon nitride, the same spacer etch may be used. Because the spacer etch is anisotropic, it etches only horizontal surfaces of the layer 62. The sidewall spacer 70 thus remains about 700 Å thick, for the preferred embodiment, though some etching will occur to the top of the spacer 70. Preferably, the spacer etch comprises a plasma or RIE etch which is conducted at least until the polysilicon of the conductive layer 62 is exposed. Some damage to the polysilicon is tolerable, since the exposed surfaces will not form part of the final structure. Indeed, the spacer etch may etch through the poly and the underlying nitride etch stop 50 of the preferred embodiment. Most preferably, the spacer etch comprises a dry nitride etch in the form of a fluorine-based RIE (with a fluorine source gas such as $CF_4$, $NF_3$ or $CHF_3$), attacking only horizontal surfaces of $Si_3N_4$, as will be understood by one having skill in the art. High energy fluorine atoms bombard the horizontal surfaces 71 of the spacer material 64 until the sidewall spacer 70 is defined and the polysilicon 62 exposed.

Figure 5:
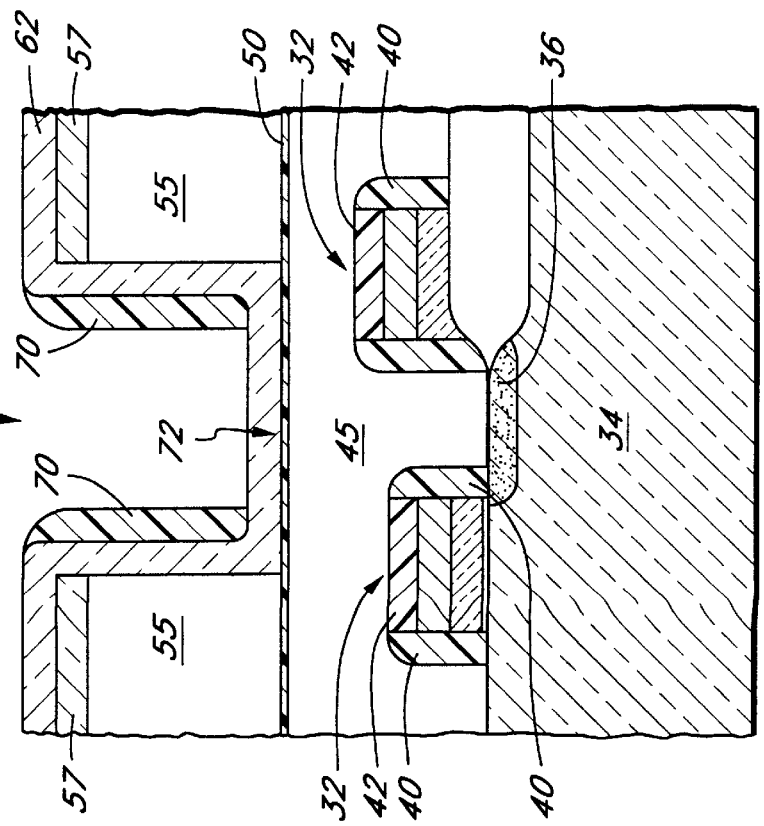

FIG. 5 illustrates the result of a contact etch, performed after formation of the sidewall spacer 70. This etch exposes the active area 36 of the access device by extending the via 60 down to the substrate 34. The contact etch may be conceived as having two parts: a first part which etches through the via bottom 72 portion of the second conductive layer 62 and the underlying etch stop film 50; and a second part which etches the insulating layer 45 down to the substrate 34 between the word lines 32. Most preferably, the first part of the contact etch comprises a polysilicon etch following the spacer etch. As will be understood by the skilled artisan, the polysilicon etch may comprise another fluorine-based etch with low selectivity and high directionality, continued until the both the polysilicon of the via bottom 72 and the thin etch stop film 50 are cleared away. Because this etch is anisotropic, minimal damage is sustained by the vertical $Si_3N_4$ spacer 70 while the horizontal etch stop film 50 is cleared. While horizontal portions of the second conductive layer 62 are etched, the first conductive layer 57 remains, protecting the structural layer 55 during the second phase of the contact etch.

The second phase comprises etching the insulating layer 45 selectively against the first conductive layer 57, in the preferred embodiment. This preferred requirement is due to the fact that the preferred structural layer 55, comprising BPSG just as the insulating layer 45, would be etched away during the second part of the contact etch if exposed at this stage. In order to maintain structural integrity, the structural layer 55 should most preferably be protected by the first conductive layer 57. Thus, a selective oxide etch, which does not etch through the polysilicon of the first conductive layer 57, is utilized to etch the BPSG of the preferred insulating layer 45. Preferably, the etch should comprise an anisotropic reactive ion etch flowing fluorocarbon source gases. Most preferably, $H_2$ gas should be added to a $CF_4$ plasma etch to improve etch selectivity against silicon, as described in Wolf and Tauber, "Silicon Processing for the VLSI Era," Vol. 1, published 1986 by Lattice Press, at pp. 547–51. As long as the contact etch is anisotropic, the vertical surfaces of the sidewall spacer 70 will be relatively unharmed, whether or not the BPSG etch of second part of the contact etch is selective against the material of the spacer 70. The contact etch may also be selective against silicon nitride, as discussed in conjunction with the via etch, so as to minimize etching of the top of preferred sidewall spacer 70 and nitride word line insulating caps 42 and spacers 40.

Figure 6:
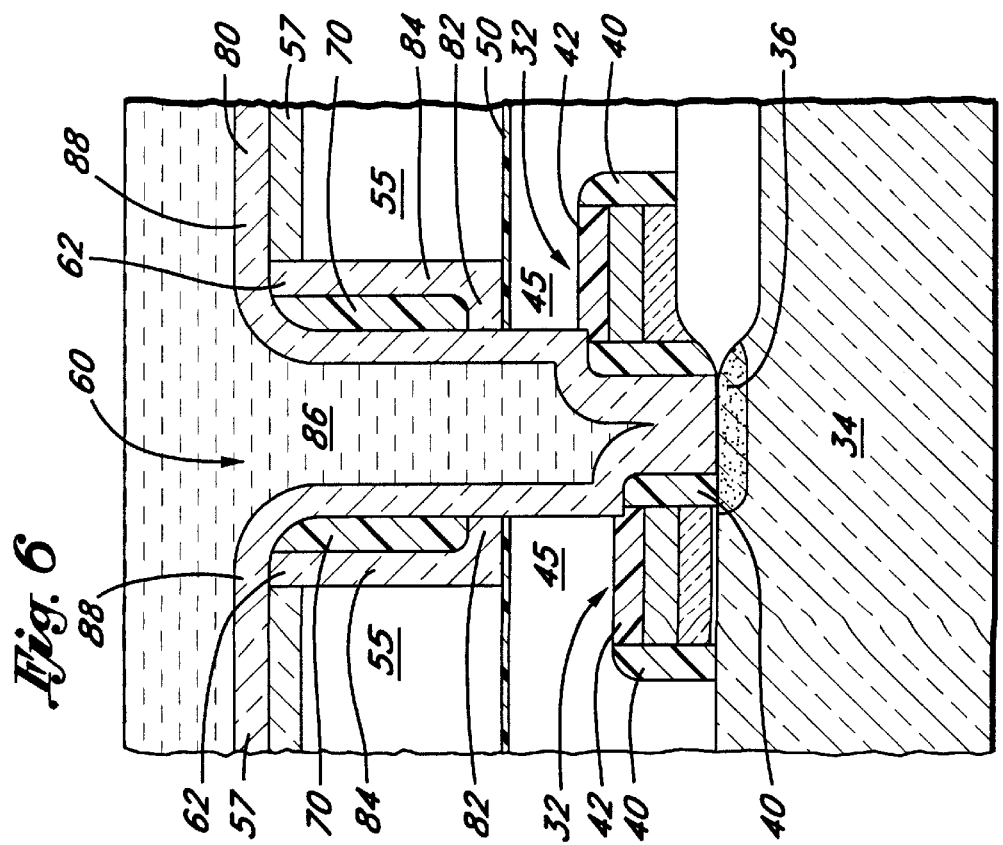

FIG. 6 illustrates the structure left after a third conductive layer 80 has been deposited over the integrated circuit and into the extended via 60. The third conductive layer 80 preferably comprises the same material and approximately the same thickness as the first and second conductive layers 57 and 62, namely polysilicon having a thickness between about 200 Å and 1,500 Å, and most preferably about 500 Å. This third conductive layer 80 fills a narrow portion of the extended via 60 between the word lines 32, making electrical contact with the active area 36. Above the word lines 32, where the via 60 widens somewhat like a cone, the third conductive layer 80 no longer fills the via 80, but rather lines the via 80 in the shape of a hollow cylinder (in the preferred embodiment), narrower and concentric with the second conductive layer 62. At the former via bottom 72 (FIG. 4, prior to the contact etch), the third conductive layer 80 and a horizontal portion 82 of the second conductive layer 62 are in electrical contact with one another. A vertical portion 84 of the second conductive layer 62 is separated from the third conductive layer 80 the sidewall spacer 70. If the size of the via 60 permits, additional spacers and conductive layers may be formed by similar processes to form additional, smaller containers.

A filler material 86 should also be deposited into the via 60 after the third conductive layer 80 has been formed. The filler 86 should fill and overflow the via 60, providing structural support to prevent breakage during subsequent processing. Preferably, the filler 86 comprises a conventional photoresist (more simply referred to as resist), which flows easily into the narrow via 60 and is easily removed.

FIG. 7 illustrates the structure after a polishing or planarization step which evenly removes the portion of the filler 86 overflowing the via 60, horizontal portions 88 of the third conductive layer 80, and remaining portions of the first conductive layer 57. Uppermost portions of the structural layer 55 should also be polished away, as should the vertical top portions of the second conductive layer 62, sidewall spacer 70 and third conductive layer. The polishing step preferably comprises a chemical mechanical planarization (CMP), most preferably using an ammonia- and silica-based slurry, as will be understood by one skilled in the art.

After the CMP, the polysilicon conductive layers 62 and 80 of the preferred embodiment resembles, in cross-section, four tines of a fork, the handle of which reaches down to make contact with the device active area 36 within the substrate 34. In three dimensions, the conductive layers 62 and 80 form a container within a container. The outside of the containers remain supported by the structural layer 55. The volume between the two containers is filled by the nitride sidewall spacer 70. The inner container is filled with the resist filler 86.

FIG. 8 illustrates the structure after the supporting materials 55, 70 and 86 have been removed by successive etches which selectively leave the polysilicon conductive layers 62 and 80 unetched. The sequence in which these layers are removed is not critical. The preferred sequence, however, comprises removal of the resist filler 86, by conventional resist strip; removal of the BPSG structural layer 55 down to the etch stop film 50, by a selective wet oxide etch (such as dilute HF solution); and removal of the nitride spacer 70. This last etch, for the preferred embodiment, should etch nitride selectively against the polysilicon of the second and third conductive layers 62 and 80. For example, hot phosphoric acid ($H_3PO_4$) will selectively etch nitride without attacking the silicon of conductive layers 62 and 80 and without attacking the BPSG insulating layer 45. The nitride etch stop film 50 of the preferred embodiment will be incidently removed by this etch. Alternative etch processes for this step include selective fluorine-based plasma etch of the spacer 70.

The remaining conductive layers 62 and 80, in electrical contact with each other and with the active area 36, represent a bottom electrode 90 for the cell capacitor. The container-within-container configuration advantageously provides a high surface area for the electrode 90, which in turn leads to higher capacitance for the memory cell. It will be understood by those of ordinary skill in the art that any surface of the bottom electrode 90 may be supplemented in alternative embodiments with a rough silicon layer, for example, in the form of hemispherical grained (HSG) silicon. HSG silicon or other rough conductive layers could thus further increase the surface area of the bottom electrode 90.

Note that the bottom electrode 90 is fabricated with the use of a single mask step, by which the original via 60 (FIG. 3) was created. No separate mask is required to form the inner container represented by the third conductive layer 62. Nor is a separate mask required to isolate various bottom electrodes of the DRAM from one another; the planarization (preferably CMP) step accomplishes that function by removing the horizontal portions of the conductive layers 80 and 57 (see FIG. 6, prior to CMP). By reducing the number of masks used, the present invention reduces both fabrication costs and risk of mask misalignment, thus increasing fabrication yield.

The memory cell fabrication may then be completed by conventional means. FIG. 9 shows the structure of the memory cell after a thin dielectric layer 92, most preferably a composite oxide-nitride-oxide (ONO) between about 150 Å and 200 Å, and top electrode 94 have been formed over the bottom electrode 90. The top electrode 94 may comprise polysilicon, and may be as thick as 3,000 Å or even greater, acting as a common reference electrode for the DRAM.

Although the foregoing invention has been described in terms of a certain preferred embodiment, other embodiments will become apparent to those of ordinary skill in the art, in view of the disclosure herein. In particular, the preferred embodiment is described in terms of certain materials, including the nitride spacers and nitride isolation of the word lines, BPSG layers, and polysilicon conductive layers. It should be understood, however, that alternative combinations of materials may be equally viable to accomplish the objects of the present invention. Accordingly, the present invention is not intended to be limited by the recitation of preferred embodiment, but is instead intended to be defined solely by reference to the appended claims.

I claim:

1. A method for providing a conductive bottom electrode for an integrated capacitor, the method comprising:

forming a first conductive layer over a structural layer formed over a semiconductor substrate;

forming a via through the first conductive layer and the structural layer, the via having a substantially vertical sidewall;

depositing a second conductive layer over the first conductive layer and into the via;

forming a sidewall spacer over the second conductive layer at the via sidewall;

performing a contact etch through an insulating layer underlying the structural layer, the contact etch extending the via downward to expose an active area within the semiconductor substrate;

depositing a third conductive layer over the structural layer and into the extended via, the third conductive layer forming electrical contact with the active area and with the second conductive layer;

planarizing the structural layer below portions of the conductive layers overlying the structural layer; and substantially removing the structural layer and the sidewall spacer.

2. The method of claim 1, wherein the via forming step comprises etching the first conductive layer and the structural layer through a mask and stopping the via etch at an etch stop film intermediate the structural layer and the insulating layer.

3. The method of claim 2, wherein the structural layer comprises BPSG the etch stop film comprises silicon nitride, and the via etch comprises etching the structural layer with a fluorine-based dry etch process.

4. The method of claim 3, wherein the fluorine-based dry etch process comprises flowing $CHF_3$, $CF_4$, $CH_2F_2$ and argon.

5. The method of claim 1, wherein the sidewall spacer forming step comprises: forming a spacer material layer over the second conductive layer within the via; and performing a spacer etch.

6. The method of claim 5, wherein the spacer etch comprises an anisotropic etch.

7. The method of claim 6, wherein the spacer material comprises silicon nitride and the spacer etch comprises a fluorine-based plasma etch.

8. The method of claim 1, wherein the contact etch comprises:

etching through a via bottom portion of the second conductive layer; and etching through the insulating layer selectively against the material of the first conductive layer.

9. The method of claim 8, wherein at least a portion of the thickness of the first conductive layer overlying the structural layer is left unetched by the etch through the via bottom portion of the second conductive layer.

10. The method of claim 8, wherein the contact etch further comprises etching through an etch stop material intermediate the second conductive layer and insulating layer.

11. The method of claim 8, wherein the first, second conductive layer comprises polysilicon, the insulating layer comprises borophosphosilicate, the sidewall spacer comprises silicon nitride, and the contact etch comprises:

performing an in situ polysilicon etch; and performing a selective fluorine-based oxide etch.

12. The method of claim 11, wherein the contact etch etches the insulating layer between two word lines over the substrate on either side of the active area.

13. The method of claim 12, wherein the word lines are insulated with silicon nitride.

14. The method of claim 1, further comprising the step of providing a filler within the contact via after depositing the third conductive layer and prior to the planarization step.

15. The method of claim 14, wherein the filler comprises a photoresist material.

16. The method of claim 14, further comprising the step of selectively removing the filler after the planarization step.

17. The method of claim 1, wherein the planarizing step comprises a chemical mechanical planarization.

18. The method of claim 17, wherein the chemical mechanical planarization comprises etching with a slurry including ammonia and silica.

19. The method of claim 1, wherein the step of substantially removing the structural layer and the sidewall spacer comprises selectively etching while leaving the second and third conductive layers substantially unetched.

20. The method of claim 19, wherein the second and third conductive layers comprise polysilicon, the sidewall spacer comprises silicon nitride, and the removing step comprises etching the sidewall spacer with phosphoric acid.

21. The method of claim 20, wherein the structural layer comprises BPSG and the removing step further comprises etching the structural layer with hydrofluoric acid.

22. The method of claim 1, wherein the first conductive layer comprises undoped polysilicon.

23. A method of forming a bottom electrode for an integrated container capacitor over a circuit node, the method comprising:

forming a conductive outer container within a structural layer overlying an insulating layer;

forming a spacer around an outer container sidewall;

performing a contact etch through a bottom of the outer container and through the insulating layer to expose the circuit node;

forming a conductive inner container in electrical contact with the circuit node and with the outer container, an inner container sidewall separated from the outer container sidewall by the spacer.

24. The method of claim 23, further comprising the steps of:

performing a planarizing etch to remove a top portion of the inner and outer containers; and selectively removing the spacer from between the containers.

25. The method of claim 23, wherein the structural layer is protected from the contact etch by a protective layer.

26. The method of claim 25, wherein the protective layer comprises at least one polysilicon layer.

27. The method of claim 23, wherein the outer container and the inner container comprise polysilicon.

28. The method of claim 23, wherein the spacer comprises silicon nitride.

29. The method of claim 23, wherein the structural layer comprises an oxide.

30. A method of providing a conductive bottom electrode for an integrated capacitor, the method comprising:

forming a conductive outer container within a structural layer overlying an insulating layer;

forming a spacer around an outer container sidewall;

performing a contact etch through a bottom of the outer container and through the insulating layer to expose a circuit node;

forming a conductive inner container in electrical contact with the circuit node and with the outer container, an inner container sidewall separated from the outer container sidewall by the spacer;

planarizing the inner and outer containers; and selectively removing the spacer from between the containers.

31. The method of claim 30, wherein the planarizing step comprises a chemical mechanical planarization.

32. A method for providing a conductive bottom electrode for an integrated capacitor, the method comprising:

providing a pair of word lines insulated by silicon nitride above a semiconductor substrate;

forming a first oxide layer over the insulated word lines;

forming a thin silicon nitride layer over the oxide layer;

forming a second oxide layer over the silicon nitride layer;

depositing a first polysilicon layer over the second oxide layer;

anisotropically etching a via through the first polysilicon layer and the second oxide layer, the via etch forming a substantially vertical via sidewall and stopping at the silicon nitride layer;

forming a conductively doped second polysilicon layer into the via and over the second first polysilicon layer;

forming a layer of second silicon nitride layer over the second polysilicon layer, performing a spacer etch on the second silicon nitride layer to form a nitride spacer adjacent a vertical portion of the second polysilicon layer within the via and covering a horizontal bottom portion of the second polysilicon layer proximate the via sidewall while exposing a bottom portion of the second polysilicon layer proximate a via center;

performing a contact etch through an exposed via bottom portion of the second polysilicon, through the first silicon nitride layer, and through the first oxide layer between the insulated word lines, the contact etch extending the via to expose the semiconductor substrate;

forming a conductively doped third polysilicon layer into the extended via and superjacent the spacer, the third polysilicon layer in electrical contact with both the semiconductor substrate and the second conductive layer;

filling the via with photoresist after forming the third polysilicon layer;

performing a chemical mechanical planarization on the integrated circuit; and selectively removing the spacer, photoresist and second oxide layer.

* * * * *